US012641886B2

(12) United States Patent
Oh et al.

(10) Patent No.: US 12,641,886 B2
(45) Date of Patent: May 26, 2026

(54) NON-SILICON SEMICONDUCTOR COMPLEMENTARY THIN FILM TRANSISTOR, METHOD OF MANUFACTURING THE SAME, AND PIXEL STRUCTURE INCLUDING THE COMPLEMENTARY THIN FILM TRANSISTOR

(71) Applicant: ELECTRONICS AND TELECOMMUNICATIONS RESEARCH INSTITUTE, Daejeon (KR)

(72) Inventors: Himchan Oh, Daejeon (KR); Jong-Heon Yang, Daejeon (KR); Ji Hun Choi, Daejeon (KR); Seung Youl Kang, Daejeon (KR); Yong Hae Kim, Daejeon (KR); Jeho Na, Daejeon (KR); Jaehyun Moon, Daejeon (KR); Chan Woo Park, Daejeon (KR); Sung Haeng Cho, Daejeon (KR); Jae-Eun Pi, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 365 days.

(21) Appl. No.: 18/459,147

(22) Filed: Aug. 31, 2023

(65) Prior Publication Data

US 2024/0079413 A1      Mar. 7, 2024

(30) Foreign Application Priority Data

Sep. 1, 2022   (KR) ........................ 10-2022-0110736
Aug. 2, 2023   (KR) ........................ 10-2023-0101109

(51) Int. Cl.
     *H01L 27/12*          (2006.01)
     *H10D 86/01*          (2025.01)
     (Continued)

(52) U.S. Cl.
     CPC ......... *H10D 86/60* (2025.01); *H10D 86/0221* (2025.01); *H10D 86/423* (2025.01); *H10K 59/1213* (2023.02)

(58) Field of Classification Search
     CPC .... H10D 86/60; H10D 86/0221; H10D 86/01; H10D 86/423; H10D 86/40;
     (Continued)

(56) References Cited

U.S. PATENT DOCUMENTS 7,902,577 B2      3/2011   Kang et al.
8,659,092 B2 *    2/2014   Chen ...................... H10D 99/00
                                                          257/369
(Continued)

FOREIGN PATENT DOCUMENTS

KR      10-2015-0019891 A      2/2015
KR      10-2021-0070157 A      6/2021
KR      10-2022-0074678 A      6/2022

OTHER PUBLICATIONS

Wan-Ling Wu et al., "An Energy Harvester Circuit with Clock Booster for Piezoelectric Energy Harvesting", 2018 IEEE, Aug. 30, 2018.
(Continued)

*Primary Examiner* — Nikolay K Yushin

(57)      ABSTRACT

A complementary thin film transistor (TFT) includes a substrate and a first TFT and a second TFT disposed on the substrate, wherein a first conductive semiconductor layer of the first TFT and a second gate electrode layer of the second TFT are disposed in the same layer and include the same material.

19 Claims, 12 Drawing Sheets

(51) Int. Cl.
    *H10D 86/40*      (2025.01)
    *H10D 86/60*      (2025.01)
    *H10K 59/121*     (2023.01)

(58) Field of Classification Search
    CPC ............. H10D 86/471; H10K 59/1213; H10K
                            59/121; H10K 59/131
    See application file for complete search history.

(56)              References Cited

U.S. PATENT DOCUMENTS

| | | | |
|---|---|---|---|
| 9,613,984 | B2 | 4/2017 | Yang et al. |
| 9,786,783 | B2 | 10/2017 | Hafez et al. |
| 10,749,016 | B2 * | 8/2020 | Zhang .................... H10D 62/80 |
| 12,002,905 | B2 * | 6/2024 | Jung .................... H10H 20/821 |
| 2010/0173360 | A1 * | 7/2010 | Umetsu ........... G01N 33/54366 |
| | | | 435/69.6 |
| 2011/0263081 | A1 | 10/2011 | Jeon et al. |
| 2012/0025320 | A1 * | 2/2012 | Chen .................... H10K 19/201 |
| | | | 257/E21.612 |
| 2017/0125452 | A1 | 5/2017 | Ide et al. |
| 2019/0334018 | A1 * | 10/2019 | Zhang ................. H10D 64/514 |
| 2021/0202800 | A1 * | 7/2021 | Jung ....................... C07F 5/027 |

OTHER PUBLICATIONS

Letizia Fragomeni et al., "CMOS fully integrated 2.5GHz active RFID tag with on-chip antenna", 2010 IEEE, Apr. 26, 2010.

* cited by examiner

NON-SILICON SEMICONDUCTOR COMPLEMENTARY THIN FILM TRANSISTOR, METHOD OF MANUFACTURING THE SAME, AND PIXEL STRUCTURE INCLUDING THE COMPLEMENTARY THIN FILM TRANSISTOR

CROSS-REFERENCE TO RELATED APPLICATIONS

This application claims the benefit of the Korean Patent Application No. 10-2022-0110736 filed on Sep. 1, 2022 and the Korean Patent Application No. 10-2023-0101109 filed on Aug. 2, 2023, which is hereby incorporated by reference as if fully set forth herein.

BACKGROUND

Field of the Invention

The present invention relates to a field effect transistor, and more particularly, to a complementary thin film transistor (TFT).

Discussion of the Related Art

Complementary transistors and a circuit configuration using the same are based on silicon semiconductor technology generally. A silicon semiconductor process may be divided into a single crystalline silicon semiconductor process and an amorphous and polycrystalline silicon semiconductor process.

The single crystalline silicon semiconductor process is a process which is performed at a high process temperature compared to a polycrystalline silicon semiconductor process, and thus, a complementary TFT is manufactured by using a substrate (for example, a silicon wafer) where a heat resistance temperature is high. That is, the single crystalline silicon semiconductor process uses a substrate where a heat resistance temperature is low like a glass or plastic substrate, and due to this, has a drawback where it is difficult to manufacture the complementary TFT.

Moreover, various complementary integrated circuits including the complementary TFT manufactured through the silicon semiconductor process may not flexibly be bent or folded because a substrate is hard. Therefore, in order to manufacture an electronic device incapable of being bent or folded, an additional post-process for transporting the manufactured complementary integrated circuit to a glass or plastic substrate is needed. Due to this, the total number of processes and the cost increase.

The polycrystalline silicon semiconductor process is lower in process temperature than the single crystalline silicon semiconductor process but needs a crystallization process of changing an amorphous silicon (a-Si) thin film to a polycrystalline silicon thin film and N-type and P-type doping processes, and due to this, there are a number of processes still.

SUMMARY

An aspect of the present invention is directed to providing a complementary thin film transistor (TFT) structure and a method of manufacturing the same, in which the complementary TFT is manufactured in a substrate having a low heat resistance temperature by using a non-silicon semiconductor without N-type and P-type doping processes and the number of processes is considerably reduced.

To achieve these and other advantages and in accordance with the purpose of the invention, as embodied and broadly described herein, there is provided a complementary thin film transistor (TFT) including: a substrate; and a first TFT and a second TFT disposed on the substrate, wherein a first conductive semiconductor layer of the first TFT and a second gate electrode layer of the second TFT are disposed in the same layer and include the same material.

In another aspect of the present invention, there is provided a method of manufacturing a complementary thin film transistor (TFT) including a first TFT and a second TFT, the method including: forming a first conductive semiconductor layer of the first TFT and a second gate electrode layer of the second TFT on a substrate; forming a gate insulation layer on the first conductive semiconductor layer and the second gate electrode layer; forming a first gate electrode layer, a first source electrode layer, and a first drain electrode layer of the first TFT on the gate insulation layer, and simultaneously, forming a second source electrode layer and a second drain electrode layer of the second TFT and a metal pad, connected with the second gate electrode layer, on the gate insulation layer; and forming a second conductive semiconductor layer electrically connected with the second source electrode layer and the second drain electrode layer, wherein the first conductive semiconductor layer and the second gate electrode layer include the same material.

In another aspect of the present invention, there is provided a pixel structure including: a substrate; a switch thin film transistor (TFT) structure and a driving TFT structure disposed on the substrate; a passivation layer covering the switch TFT structure and the driving TFT structure; a pixel electrode layer disposed on the passivation layer and electrically connected with a source electrode layer of the driving TFT through a contact hole formed in the passivation layer; and an organic light emitting diode (OLED) layer disposed on the pixel electrode layer, wherein a conductive semiconductor layer of the switch TFT structure and a gate electrode layer of the driving TFT structure are disposed in the same layer and include the same material.

In an embodiment, when the conductive semiconductor layer is an n-type semiconductor layer, the gate electrode layer may include the same material as a material of the n-type semiconductor layer, and when the conductive semiconductor layer is a p-type semiconductor layer, the gate electrode layer may include the same material as a material of the p-type semiconductor layer.

In an embodiment, the conductive semiconductor layer may be a channel layer on which impurities are not doped.

In an embodiment, the conductive semiconductor layer and the gate electrode layer may be simultaneously formed by one process.

It is to be understood that both the foregoing general description and the following detailed description of the present invention are exemplary and explanatory and are intended to provide further explanation of the invention as claimed.

DETAILED DESCRIPTION OF THE INVENTION

Hereinafter, example embodiments of the invention will be described in detail with reference to the accompanying drawings. In describing the invention, to facilitate the entire understanding of the invention, like numbers refer to like elements throughout the description of the figures, and a repetitive description on the same element is not provided.

In the following description, the technical terms are used only for explain a specific exemplary embodiment while not limiting the present invention. The terms of a singular form may include plural forms unless referred to the contrary. The meaning of 'comprise', 'include', or 'have' specifies a property, a region, a fixed number, a step, a process, an element and/or a component but does not exclude other properties, regions, fixed numbers, steps, processes, elements and/or components.

Figure 1:
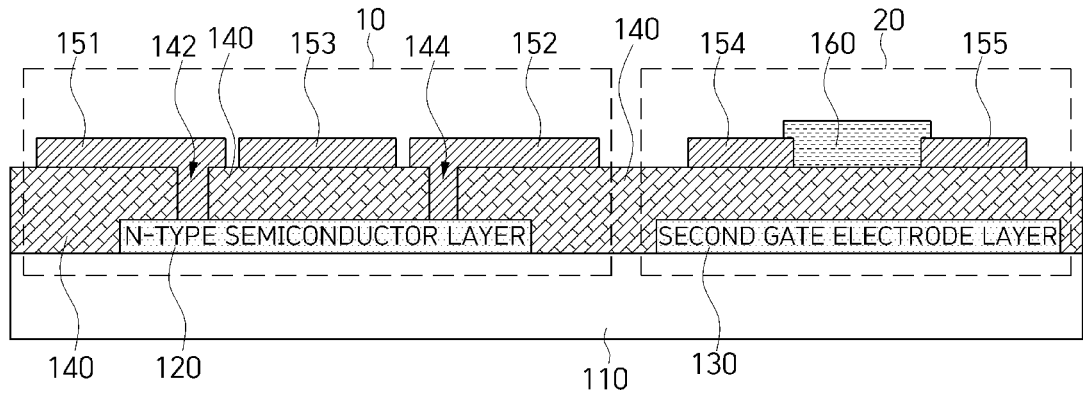
FIG. 1 is a cross-sectional view illustrating a structure of a complementary thin film transistor (TFT) according to an embodiment of the present disclosure.

FIG. 1 is a cross-sectional view illustrating a structure of a complementary thin film transistor (TFT) according to an embodiment of the present disclosure.

Referring to FIG. 1, the complementary TFT according to an embodiment of the present disclosure may include a substrate 110 and first and second TFTs 10 and 20 disposed on the substrate 110.

The substrate 110 may be a non-silicon substrate having a low heat resistance temperature. Accordingly, the complementary TFT according to an embodiment of the present disclosure may be manufactured at a low process temperature. The non-silicon substrate may be, for example, a glass or plastic substrate. A material of the glass substrate may be, for example, quartz or sapphire.

The complementary TFT according to an embodiment of the present disclosure may be characterized in that a conductive semiconductor layer (hereinafter referred to as a first conductive semiconductor layer) of the first TFT 10 and a gate electrode layer (hereinafter referred to as a second gate electrode layer) of the second TFT 20 are disposed in the same layer and include the same material. For example, a material of the gate electrode layer of the second TFT 20 may be the same as a material of the conductive semiconductor layer of the first TFT 10. Therefore, the conductive semiconductor layer of the first TFT 10 and the gate electrode layer of the second TFT 20 may be simultaneously formed in one process (for example, a deposition process), and the total number of manufacturing processes and a process time may be reduced.

In detail, the first TFT 10 may include a gate insulation layer 140, which is disposed on the first conductive semiconductor layer 120 provided in the same layer as the second gate electrode layer 130 of the second TFT 20, and a first source electrode layer 151 and a first drain electrode layer

152 which are electrically connected with the first conductive semiconductor layer 120, and may include a first gate electrode layer 153 which is disposed in the same layer as the first source electrode layer 151 and the first drain electrode layer 152 and is provided between the first source electrode layer 151 and the first drain electrode layer 152.

The first conductive semiconductor layer 120 may be an n-type semiconductor layer or a p-type semiconductor layer. When the first conductive semiconductor layer 120 is the n-type semiconductor layer, the second gate electrode layer 130 may include the same material as that of the n-type semiconductor layer, and when the first conductive semiconductor layer 120 is the p-type semiconductor layer, the second gate electrode layer 130 may include the same material as that of the p-type semiconductor layer. In the present embodiment, the first conductive semiconductor layer 120 may be assumed to be the n-type semiconductor layer. Accordingly, the second conductive semiconductor layer 160 of the second TFT 20 may be assumed to be the p-type semiconductor layer.

The gate insulation layer 140 may include a first contact hole. The first contact hole may include two contact holes 142 and 144. The contact hole 142 may electrically connect the n-type semiconductor layer 120 with the first source electrode layer 151, and the other contact hole 144 may electrically connect the n-type semiconductor layer 120 with the first drain electrode layer 152.

The second TFT 20 may include a gate insulation layer 140 which is disposed on the second conductive semiconductor layer 130 provided in the same layer as the n-type semiconductor layer 120, a second source electrode layer 154 and a second drain electrode layer 155 which are disposed on the gate insulation layer 140, a metal pad (156 of FIGS. 4 and 5) which is provided in the same layer as the second source electrode layer 154 and the second drain electrode layer 155 and is electrically connected with the second gate electrode layer 130, and the p-type semiconductor layer 160 (the second conductive semiconductor layer) which contacts the second source electrode layer 154 and the second drain electrode layer 155.

Although not shown in FIG. 1, the metal pad (156 of FIGS. 4 and 5) may be electrically connected with the second gate electrode layer 130 through a second contact hole (146 of FIG. 3) patterned in the gate insulation layer 140.

FIGS. 2 to 5 are layouts for describing a method of manufacturing the complementary TFT illustrated in FIG. 1.

Figure 2:
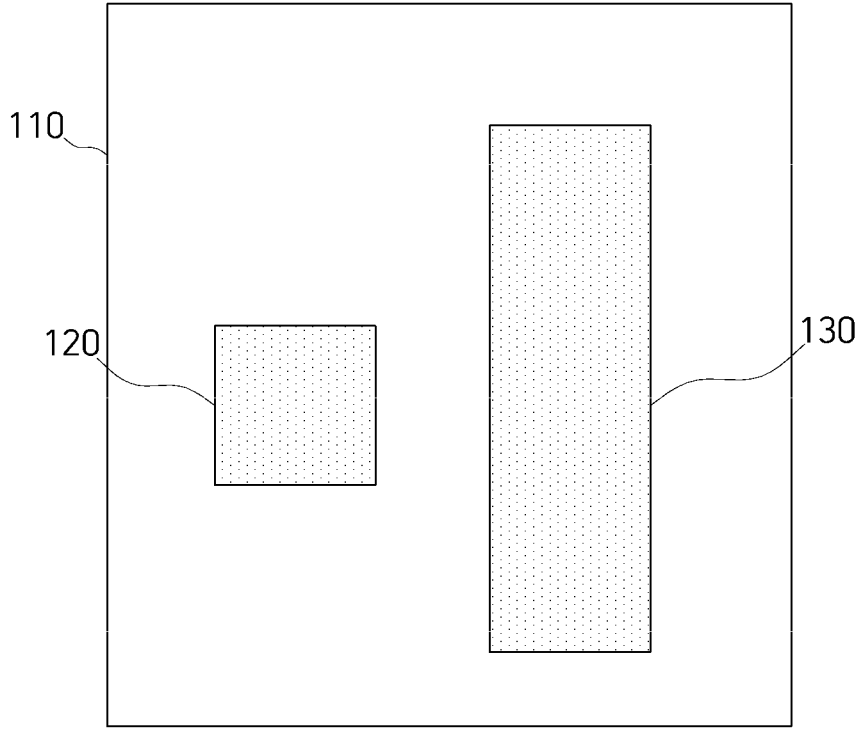
FIG. 2, FIG. 3, FIG. 4, and FIG. 5 are layouts for describing a method of manufacturing the complementary TFT illustrated in FIG. 1.

Referring to FIG. 2, the n-type semiconductor layer (the first conductive semiconductor layer) 120 of the first TFT 10 and the second gate electrode layer 130 of the second TFT 20 may be formed on the substrate 110.

In an embodiment, the n-type semiconductor layer 120 and the second gate electrode layer 130 may be simultaneously formed by one deposition process in the same layer. Here, the deposition process may include, for example, a chemical vapor deposition (CVD) process and a physical vapor deposition (PVD) process. Before, the deposition process, a photolithography process for patterning positions of the n-type semiconductor layer 120 and the second gate electrode layer 130 may be further performed on the substrate 110.

The n-type semiconductor layer 120 may function as a channel layer of the first TFT 10 on which an n-type dopant is not doped. Therefore, in the present embodiment, a doping process of doping an n-type dopant on the n-type semiconductor layer 120 to form the channel layer of the first TFT 10 may be omitted. Because such a doping process is omitted, the number of processes and a process time may be reduced. Also, the n-type semiconductor layer 120 and the second gate electrode layer 130 may be simultaneously formed by one deposition process, and thus, the number of processes and a process time may be more reduced.

A material of the second gate electrode layer 130 may be the same material as a material of the n-type semiconductor layer 120. When the n-type semiconductor layer 120 of the first TFT 10 is the p-type semiconductor layer, a material of the second gate electrode layer 130 may be the same material as a material of the p-type semiconductor layer.

In an embodiment, a material of the n-type semiconductor layer may use one material of a zinc oxide (ZnO)-based material, an indium oxide (InO)-based material, a tin oxide (SnO)-based material, a titanium oxide (TiO)-based material, an indium-gallium-zinc oxide (InGaZnO)-based material, a manganese-tin-indium oxide (ZnSnInO)-based material, an indium tin oxide (InSnO)-based material, and a combination of at least two materials thereof.

In an embodiment, a material of the p-type semiconductor layer may use one material of a tellurium (Te)-based material, a tellurium oxide (TeOx)-based material, a selenium (Se)-based material, a copper oxide (CuO)-based material, a tin oxide (SnO)-based material, a nickel oxide (NiOx)-based material, and a combination of at least two materials thereof.

Subsequently, referring to FIG. 3, a process of forming the gate insulation layer 140, covering the n-type semiconductor layer (the first conductive semiconductor layer) 120 and the second gate electrode layer 130, on a front surface of the substrate 110, and then, patterning the gate insulation layer 140 to form the first contact holes 142 and 144 on the n-type semiconductor layer 120 and form the second contact hole 146 on the second gate insulation layer 130 may be performed.

Figure 3:
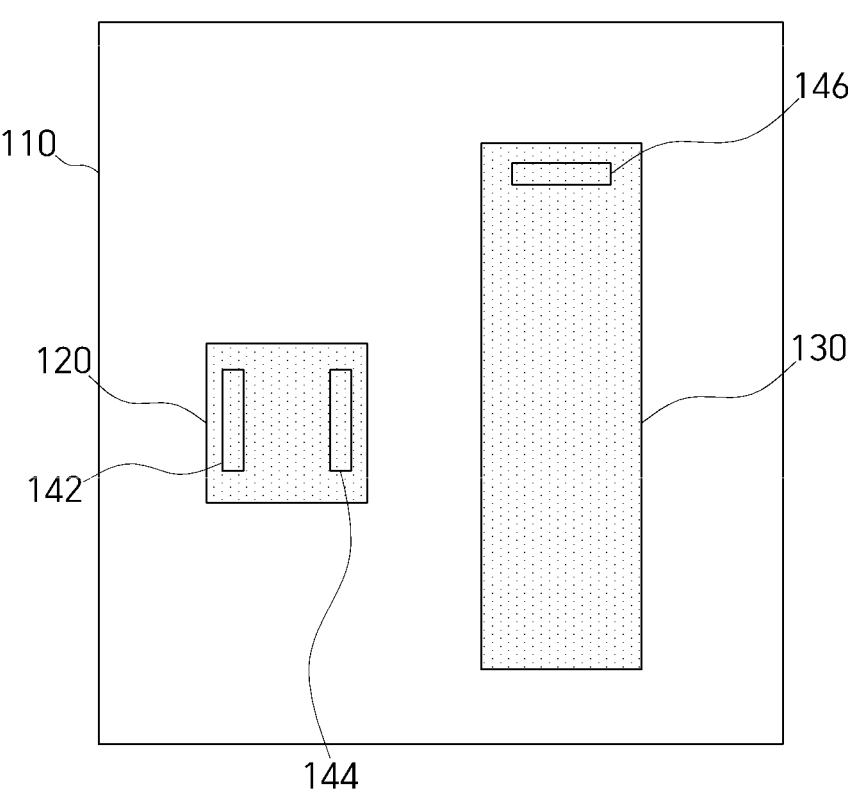

To help understand the drawings, the gate insulation layer 140 is not shown in FIG. 3. The first contact holes 142 and 144 may include two contact holes 142 and 144, the contact hole 142 may connect the n-type semiconductor layer 120 with the first source electrode layer 151, and the other contact hole 144 may connect the n-type semiconductor layer 120 with the first drain electrode layer 152.

To form the first contact holes 142 and 144 and the second contact hole 146 on the gate insulation layer 140, a photolithography process and an etching process may be used. The etching process may include, for example, a dry etching process and/or a wet etching process.

Figure 4:
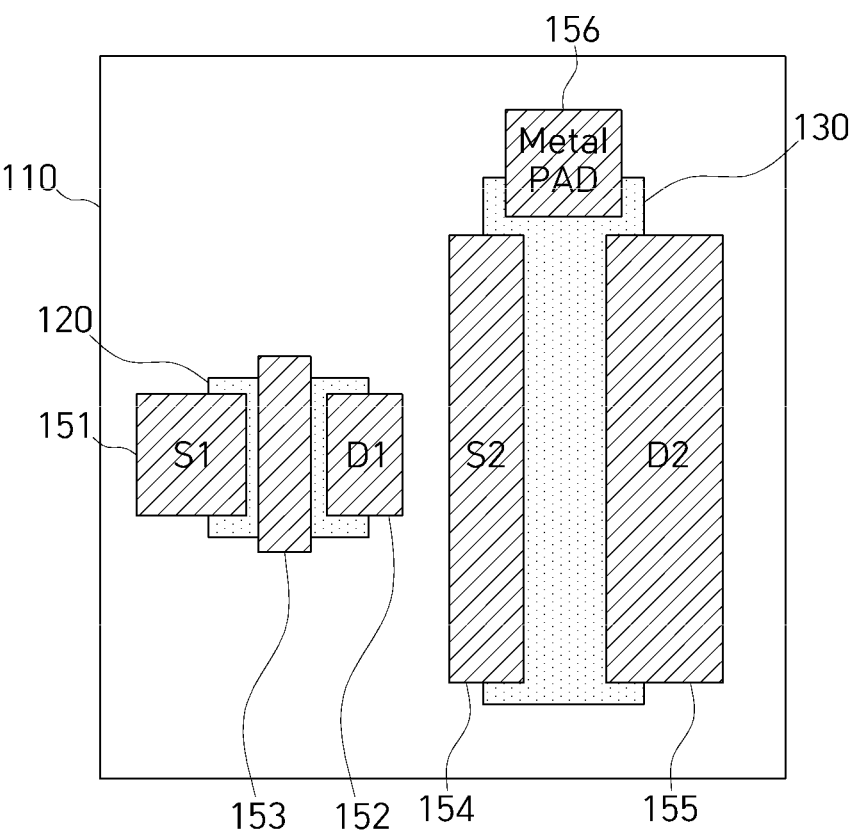

Subsequently, referring to FIG. 4, a process of forming the first source electrode layer 151 and the first drain electrode layer 152 partially overlapping the n-type semiconductor layer 120 with the gate insulation layer 140 therebetween, and simultaneously, forming the first gate electrode layer 153, crossing the n-type semiconductor layer 120, between the first source electrode layer 151 and the first drain electrode layer 152 may be performed. Therefore, the first TFT 10 may be finished.

Moreover, a process of forming the second source electrode layer 154 and the second drain electrode layer 155, partially overlapping the second gate electrode layer 130, on the gate insulation layer 140, and simultaneously, forming the metal pad 156, partially overlapping the second gate electrode layer 130, on the gate insulation layer 140 may be performed.

The first source electrode layer 151, the first drain electrode layer 152, the first gate electrode layer 153, the second source electrode layer 154, the second drain electrode layer 155, and the metal pad 156 may include the same material and may be simultaneously formed by one deposition process. Here, the deposition process may include, for example, the CVD process and the PVD process.

The first source electrode layer 151 and the first drain electrode layer 152 may be electrically connected with the n-type semiconductor layer 120 by the first contact holes (142 and 144 of FIGS. 1 and 3), and the metal pad 156 may be electrically connected with the second gate electrode layer 130 by the second contact hole 146.

Subsequently, referring to FIG. 5, a process of forming the p-type semiconductor layer (the second conductive semiconductor layer) 160 on a surface of the gate insulation layer 140 (not shown in FIG. 5) between the second source electrode layer 154 and the second drain electrode layer 155 and a partial surface of each of the second source electrode layer 154 and the second drain electrode layer 155 may be performed. Therefore, the p-type semiconductor layer 160 may be electrically connected with the second source electrode layer 154 and the second drain electrode layer 155.

The p-type semiconductor layer 160 may function as a channel layer of the second TFT 20 on which a p-type dopant is not doped. Therefore, in the present embodiment, a doping process of doping an n-type dopant on the p-type semiconductor layer 120 to form the channel layer of the second TFT 20 may be omitted. Because such a doping process is omitted, the number of processes and a process time may be reduced.

As described above, the complementary TFT according to an embodiment of the present disclosure may include a non-silicon substrate having a low heat resistance temperature like a glass substrate such as quartz or sapphire instead of a conventional silicon substrate (silicon wafer) having a high heat resistance temperature, and thus, the complementary TFT may be manufactured at a low process temperature.

Moreover, the first conductive semiconductor layer 120 of the first TFT 10 and the second gate electrode layer 130 of the second TFT 20 may be formed of the same material in the same layer, and thus, the first conductive semiconductor layer 120 of the first TFT 10 and the second gate electrode layer 130 of the second TFT 20 may be simultaneously formed in the same process without a doping process, thereby decreasing the total number of manufacturing processes of the complementary TFT.

The complementary TFT according to an embodiment of the present invention may be used to design various application circuits such as a complementary metal oxide semiconductor (CMOS) logic circuit including a CMOS inverter, a CMOS NAND circuit, a CMOS NOR circuit, a CMOS AND circuit, and a CMOS OR circuit, a CMOS arithmetic logic unit (ALU), a CMOS microprocessor, a CMOS RFID TAG circuit, a CMOS image sensor, an energy harvester circuit, and a display pixel circuit.

Figure 5:
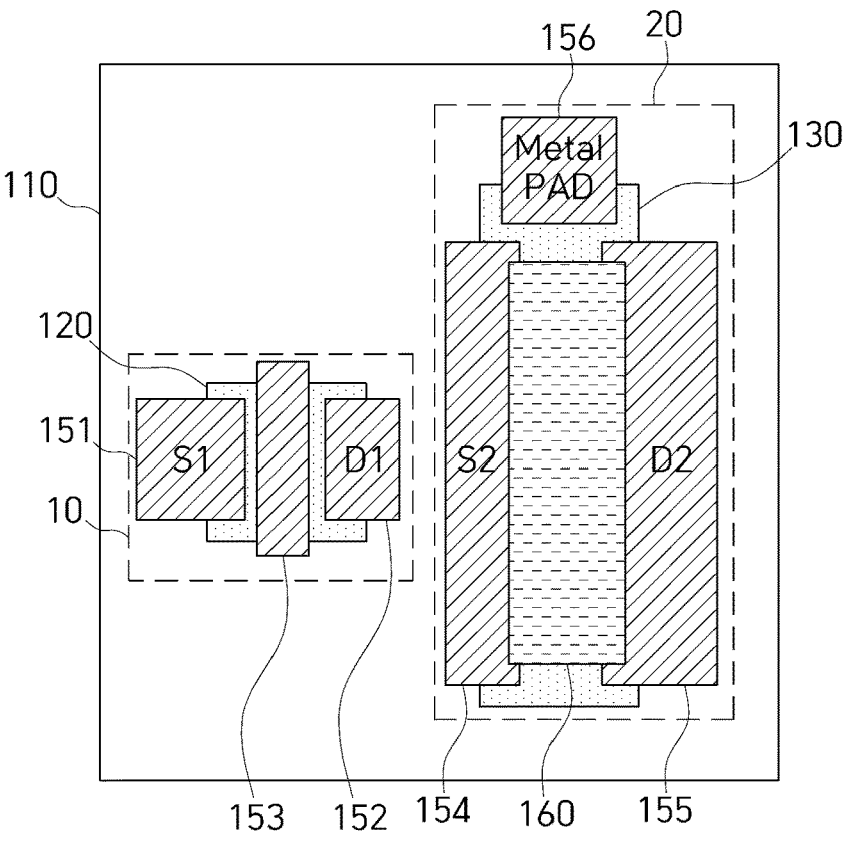
Figure 6:
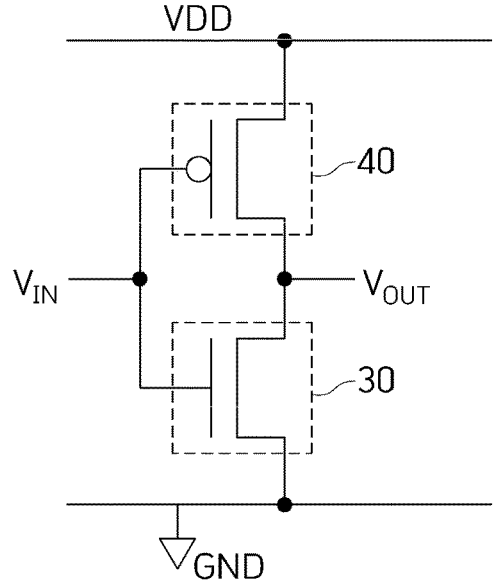
FIG. 6 is an equivalent circuit diagram of a complementary metal oxide semiconductor (CMOS) inverter including the complementary TFT illustrated in FIG. 1 and FIG. 5.
Figure 7:
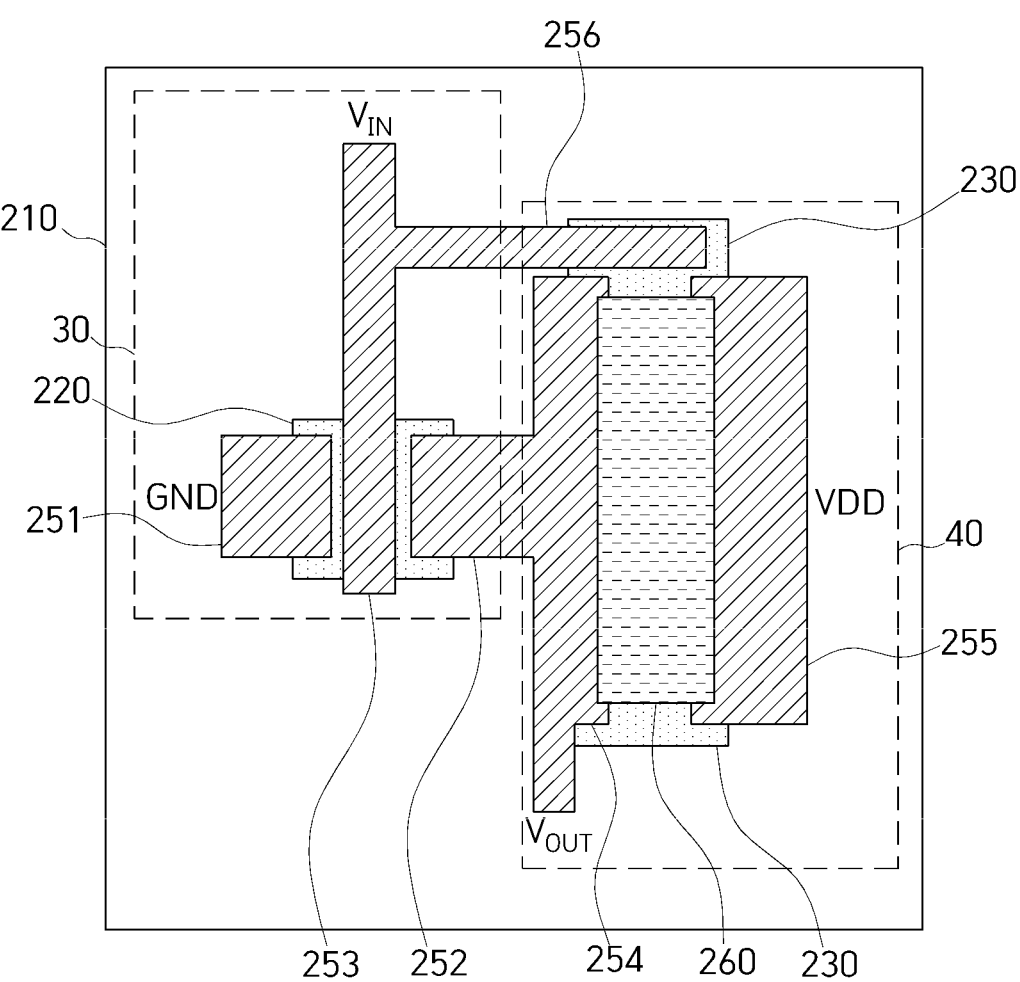
FIG. 7 is a layout of the CMOS inverter illustrated in FIG. 6.

FIG. 6 is an equivalent circuit diagram of a CMOS inverter including the complementary TFT illustrated in FIGS. 1 and 5, and FIG. 7 is a layout of the CMOS inverter illustrated in FIG. 6.

Referring to FIGS. 6 and 7, the CMOS inverter according to an embodiment of the present disclosure may include a substrate 210 and third and fourth TFTs 30 and 40 disposed on the substrate 210.

The substrate 210 may be a non-silicon substrate having a low heat resistance temperature. The non-silicon substrate may be, for example, a glass or plastic substrate. A material of the glass substrate may be, for example, quartz or sapphire.

In the CMOS inverter according to an embodiment of the present disclosure, a conductive semiconductor layer 220 of the third TFT 30 and a gate electrode layer 230 of the fourth TFT 40 may be disposed in the same layer and may include the same material. For example, a material of the gate electrode layer 230 of the fourth TFT 40 may be the same as a material of the conductive semiconductor layer 220.

Therefore, the conductive semiconductor layer 220 of the third TFT 30 and the gate electrode layer 230 of the fourth TFT 40 may be simultaneously formed in one process (for example, a deposition process), and the total number of manufacturing processes of the CMOS inverter may be reduced.

In detail, the third TFT 30 may include a gate insulation layer (not shown in FIG. 6), which is disposed on the first conductive semiconductor layer 220 provided in the same layer as the second gate electrode layer 230, and a first source electrode layer 251 and a first drain electrode layer 252 which are disposed on the gate insulation layer and are electrically connected with the first conductive semiconductor layer 220, and may include a first gate electrode layer 253 which is disposed in the same layer as the first source electrode layer 251 and the first drain electrode layer 252 and is provided between the first source electrode layer 251 and the first drain electrode layer 252.

The first conductive semiconductor layer 220 may be an n-type semiconductor layer or a p-type semiconductor layer. When the first conductive semiconductor layer 220 is the n-type semiconductor layer, the second gate electrode layer 230 may include the same material as that of the n-type semiconductor layer, and when the first conductive semiconductor layer 220 is the p-type semiconductor layer, the second gate electrode layer 230 may include the same material as that of the p-type semiconductor layer.

Although not shown in FIG. 7, the gate insulation layer (140 of FIG. 1) may include the first contact holes (142 and 144 of FIG. 1). One contact hole (142 of FIG. 1) may electrically connect the first conductive semiconductor layer 220 with the first source electrode layer 251, and the other contact hole (144 of FIG. 1) may electrically connect the first conductive semiconductor layer 220 with the first drain electrode layer 252.

The third TFT 40 may include the gate insulation layer which is disposed on the second gate electrode layer 230 provided in the same layer as the first conductive semiconductor layer 220, a second source electrode layer 254 and a second drain electrode layer 255 which are disposed on the gate insulation layer, a metal pad 256 which is provided in the same layer as the second source electrode layer 254 and the second drain electrode layer 255 and is electrically connected with the second gate electrode layer 230, and a second conductive semiconductor layer 260 which is electrically connected with the second source electrode layer 254 and the second drain electrode layer 255.

The metal pad 256 may be electrically connected with second gate electrode layer 230 through a second contact hole (146 of FIG. 3) patterned in the gate insulation layer.

In an embodiment of the present disclosure, the first drain electrode layer 252 may be electrically connected with the second source electrode layer 254. That is, the first drain electrode layer 252 and the second source electrode layer 254 may be provided as one electrode layer. Also, the first gate electrode layer 253 may be electrically connected with the metal pad 256. That is, the first gate electrode layer 253 and the metal pad 256 may be provided as one electrode layer. Also, the first gate electrode layer 253 and the metal pad 256 provided as one electrode layer may function as an input terminal which receives an input signal, and the first drain electrode layer 252 and the second source electrode layer 254 provided as one electrode layer may function as an output terminal which outputs an output signal. Also, the first source electrode layer 251 may be connected to a ground. Accordingly, the CMOS inverter may be implemented.

Figure 8:
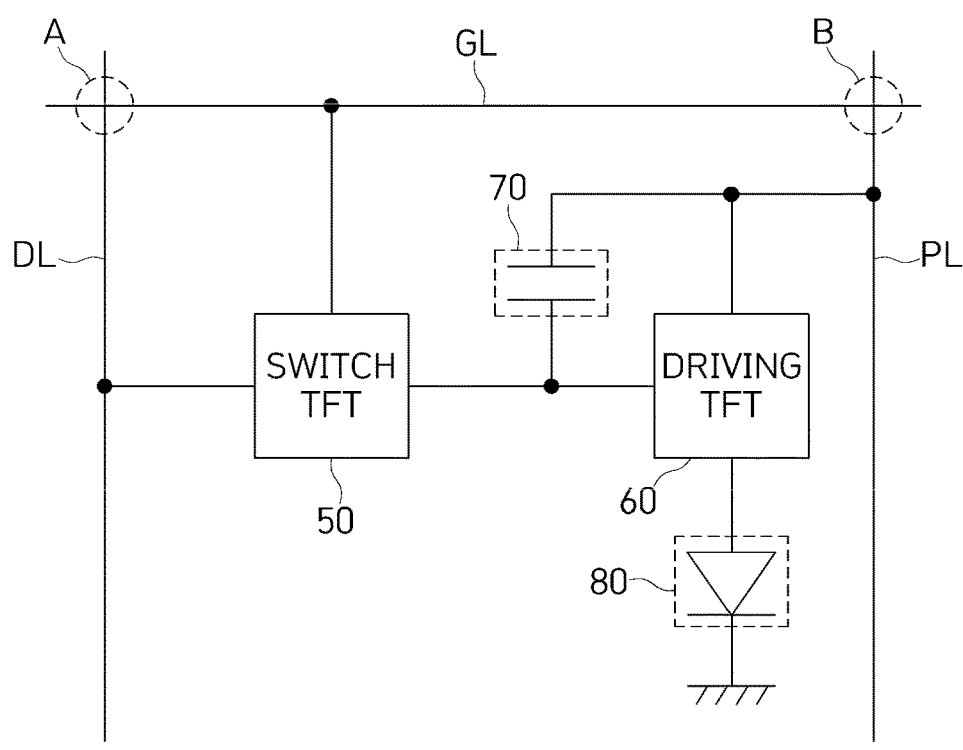
FIG. 8 is an equivalent circuit diagram of a single pixel including the complementary TFT illustrated in FIG. 1 and FIG. 5 in a display backplane according to an embodiment of the present invention.
Figure 9:
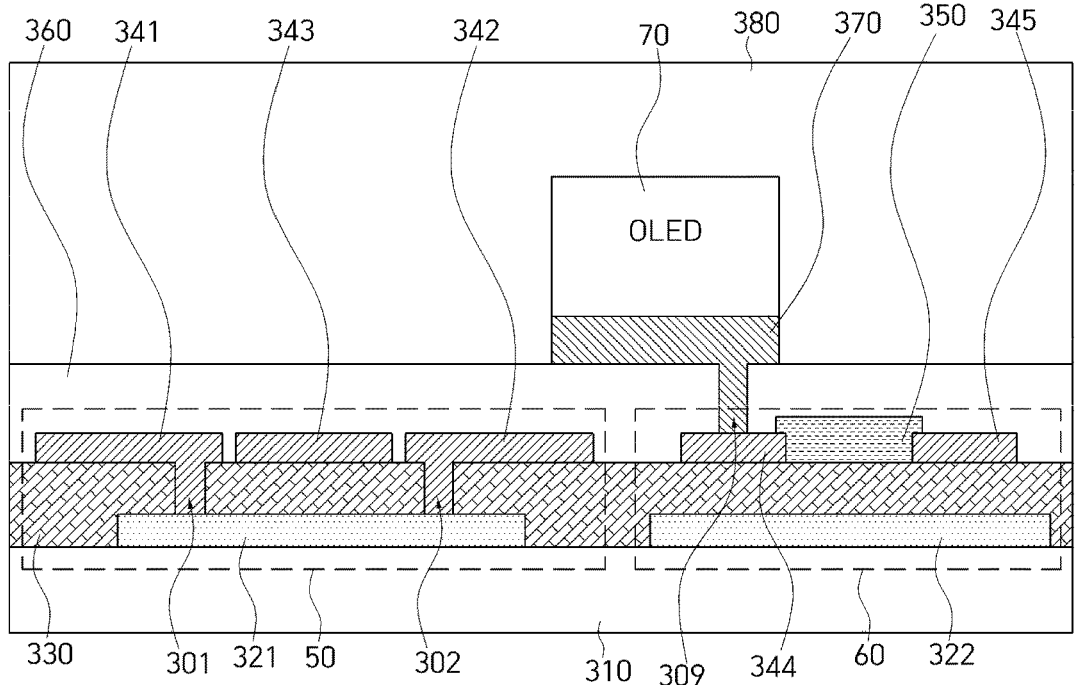
FIG. 9 is a cross-sectional view illustrating a structure of the single pixel illustrated in FIG. 8.

FIG. 8 is an equivalent circuit diagram of a single pixel including the complementary TFT illustrated in FIGS. 1 and 5 in a display backplane according to an embodiment of the present invention, and FIG. 9 is a cross-sectional view illustrating a structure of the single pixel illustrated in FIG. 8.

First, referring to FIG. 8, a single pixel may include a gate line GL, a data line DL, a power line PL, a switch TFT 50, a driving TFT 60, a storage capacitor 70, and an organic light emitting diode (OLED) 80.

The gate line GL may intersect with the data line DL and the power line PL and may apply a gate voltage, which is for controlling a switching operation of the switch TFT 50, to the switch TFT 50.

The data line DL may apply a data voltage (a source voltage or a pixel voltage) to the switch TFT 50. That is, the data line DL may apply the data voltage to the unit pixel.

The power line PL may apply a continuous power voltage VDD to the driving TFT 60 and the storage capacitor 70 for one frame time.

The switch TFT 50 may control a path between the data line DL and a gate electrode of the driving TFT 60. The switch TFT 50 may have the same structure as that of the first TFT 10 of the complementary TFT illustrated in FIGS. 1 and 5.

The driving TFT 60 may control the amount of current flowing in the OLED 80, based on a switching operation based on a data voltage transferred through the switch TFT 50 and a capacitor voltage of the storage capacitor 70. The switch TFT 60 may have the same structure as that of the second TFT 20 of the complementary TFT illustrated in FIGS. 1 and 5.

The storage capacitor 70 may hold a power voltage (or a programmed gate voltage) applied through the power line PL for the one frame time.

The OLED 80 may emit light, based on the amount of current controlled by the driving TFT 60.

The present invention may have features in operations of the elements included in the single pixel, and thus, detailed descriptions thereof may be replaced with descriptions of an OLED pixel circuit which is widely known.

Hereinafter, a structure of the single pixel illustrated in FIG. 8 will be described in detail. In FIG. 9, for conciseness of the drawing, the illustration of some elements illustrated in FIG. 8 is omitted. For example, a structure of each of the gate line GL, the data line DL, the power line PL, and the storage capacitor 70 illustrated in FIG. 8 is not illustrated in FIG. 9.

Referring to FIG. 9, a single pixel may include a substrate 310, the switch TFT 50 disposed on the substrate 310, and the driving TFT 60 disposed on the substrate 310, and additionally, may include an OLED layer electrically connected with the driving TFT 60.

The substrate 310 may be a non-silicon substrate having a low heat resistance temperature, and for example, may be a glass substrate including a quartz or sapphire material.

The switch TFT 50 may include a first conductive semiconductor layer 321 disposed on the substrate 310 and a gate insulation layer 330 disposed on the first conductive semiconductor layer 321, and moreover, may further include a first source electrode layer 341 and a first drain electrode layer 342, which are disposed on the gate insulation layer 330, and a first gate electrode layer 343 disposed between the first source electrode layer 341 and the first drain electrode layer 342. Here, the first source electrode layer 341, the first drain electrode layer 342, and the first gate electrode layer 343 may be disposed in the same layer. The first conductive semiconductor layer 321 may be a channel layer and may be electrically connected with the first source electrode layer 341 and the first drain electrode layer 342 by two contact holes 301 and 302.

The driving TFT 60 may include a second gate electrode layer 322 disposed on the substrate 310 and the gate insulation layer 330 disposed on the second gate electrode layer 322, and moreover, may further include the second source electrode layer 344 and the second drain electrode layer 345 which are disposed on the gate insulation layer 330. Also, the driving TFT 60 may include a second conductive semiconductor layer 350 which is disposed between the second source electrode layer 344 and the second drain electrode layer 345 and contacts one end portion of each of the second source electrode layer 344 and the second drain electrode layer 345.

In an embodiment, the first conductive semiconductor layer 321 of the switch TFT 50 and the second gate electrode layer 322 of the driving TFT 60 may be disposed in the same layer and may include the same material. Therefore, the first conductive semiconductor layer 321 and the second gate electrode layer 322 may be simultaneously formed in one process (for example, a deposition process), and the number of processes and a process time of the display pixel may be reduced.

In an embodiment, the first conductive semiconductor layer 321 may be a channel layer of the switch TFT 50 and may be an n-type semiconductor layer or a p-type semiconductor layer. The second conductive semiconductor layer 350 may be a channel layer of the driving TFT 60. When the first conductive semiconductor layer 321 is the n-type semiconductor layer, the second conductive semiconductor layer 350 may be the p-type semiconductor layer, and otherwise, the second conductive semiconductor layer 350 may be the n-type semiconductor layer.

In an embodiment, when the first conductive semiconductor layer 321 is the n-type semiconductor layer, the second gate electrode layer 322 of the driving TFT 60 may include the same material as that of the n-type semiconductor layer. When the first conductive semiconductor layer 321 is the p-type semiconductor layer, the second gate electrode layer 322 of the driving TFT 60 may include the same material as that of the p-type semiconductor layer.

In an embodiment, a first conductive-type dopant may not be doped on the first conductive semiconductor layer 321, and a second conductive-type dopant may not be doped on the second conductive semiconductor layer 350. Accordingly, in the present invention, a doping process may be omitted, and the number of processes and a process time may be more reduced.

The single pixel may further include a passivation layer 360 which protects the switch TFT 50 and the driving TFT 60, a pixel electrode layer 370 disposed on the passivation layer 360, the OLED 70 disposed on a surface of the pixel electrode layer 370, and an encapsulation layer 380 which protects the OLED 70. The pixel electrode layer 370 may be electrically connected with the second source electrode layer 344 of the driving TFT 60 through a contact hole 303 patterned in the passivation layer 360.

FIGS. 10 to 15 are layouts for describing a method of manufacturing the single pixel illustrated in FIGS. 8 and 9.

Figure 10:
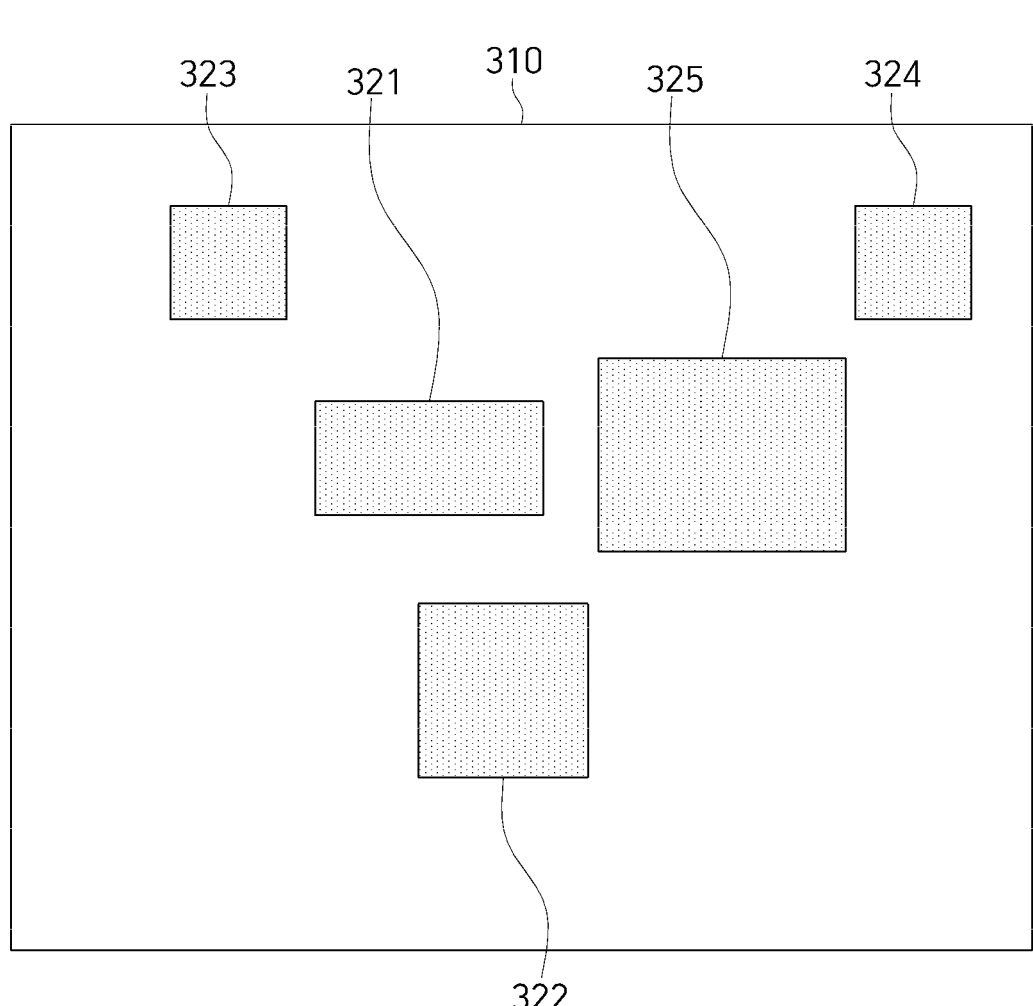
FIG. 10, FIG. 11, FIG. 12, FIG. 13, FIG. 14, and FIG. 15 are layouts for describing a method of manufacturing the single pixel illustrated in FIG. 8 and FIG. 9.

First, referring to FIG. 10, a process of simultaneously forming the first conductive semiconductor layer 321 of the switch TFT 50, the second gate electrode layer 322 of the driving TFT 60, a first bridge layer 323, a second bridge layer 324, and a bottom electrode layer 325 of the storage capacitor 70 on the substrate 310 may be performed. To simultaneously form the elements 321 to 325, the deposition process may be used. The deposition process may include, for example, a photolithography process, a PVD process, and a CVD process.

The first bridge layer 323 may function as a partial path of the data line DL passing through a lower portion of the gate line (GL of FIG. 8) at an intersection point (A of FIG. 8) between the gate line (GL of FIG. 8) and the data line (DL of FIG. 8). The second bridge layer 324 may function as a partial path of the power line PL passing through the lower portion of the gate line (GL of FIG. 8) at an intersection point (B of FIG. 8) between the gate line GL and the power line PL.

In an embodiment, the first conductive semiconductor layer 321, the second gate electrode layer 322, the first bridge layer 323, the second bridge layer 324, and the bottom electrode layer 325A may include the same material. For example, the second gate electrode layer 322, the first bridge layer 323, the second bridge layer 324, and the bottom electrode layer 325A may include the same material as that of the first conductive semiconductor layer 321.

In an embodiment, when the first conductive semiconductor layer 321 is the n-type semiconductor layer, the elements 322 to 325 may include the same material as that of the n-type semiconductor layer. A material of the n-type semiconductor layer may use, for example, one material of a zinc oxide (ZnO)-based material, an indium oxide (InO)-based material, a tin oxide (SnO)-based material, a titanium oxide (TiO)-based material, an indium-gallium-zinc oxide (InGaZnO)-based material, a manganese-tin-indium oxide (ZnSnInO)-based material, an indium tin oxide (InSnO)-based material, and a combination of at least two materials thereof.

In an embodiment, when the first conductive semiconductor layer 321 is the p-type semiconductor layer, the elements 322 to 325 may include the same material as that of the p-type semiconductor layer. A material of the p-type semiconductor layer may use, for example, one material of a tellurium (Te)-based material, a tellurium oxide (TeOx)-based material, a selenium (Se)-based material, a copper oxide (CuO)-based material, a tin oxide (SnO)-based material, a nickel oxide (NiOx)-based material, and a combination of at least two materials thereof.

Figure 11:
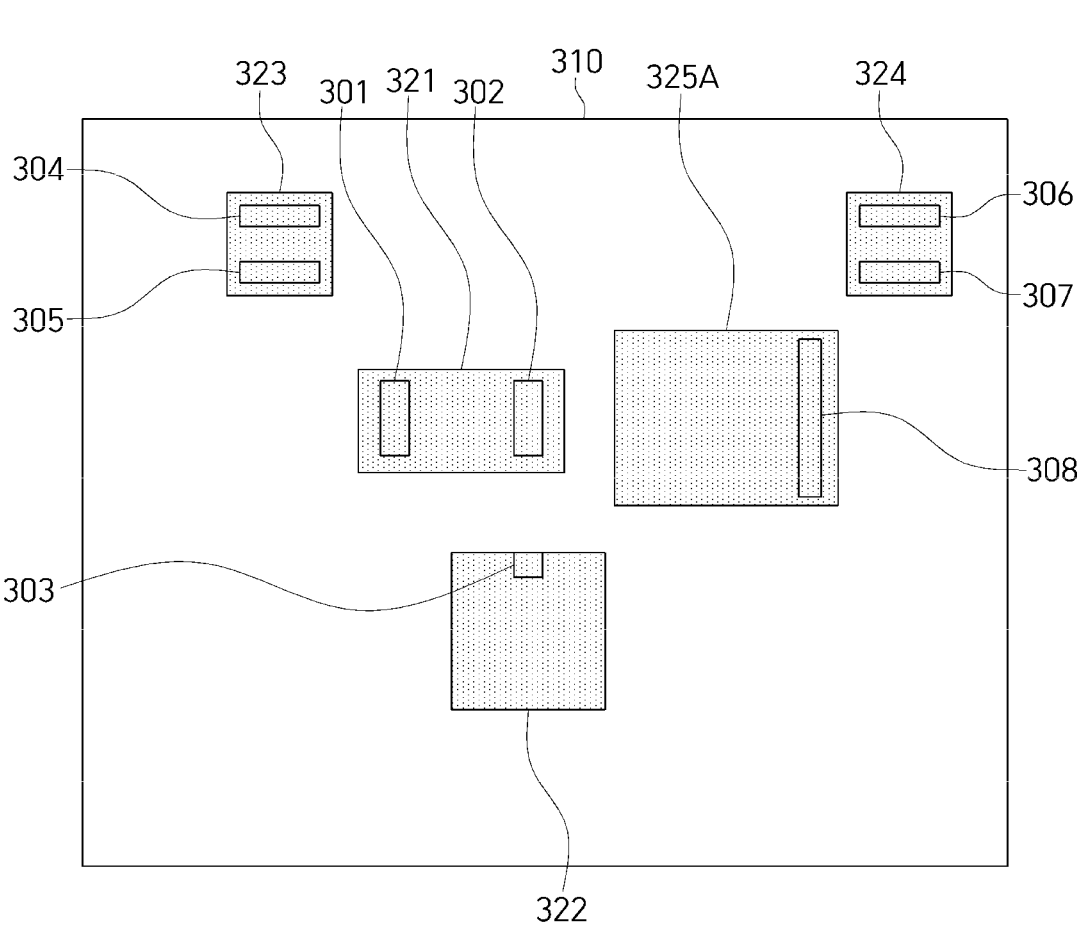

Subsequently, referring to FIG. 11, a process of forming the gate insulation layer (330 of FIG. 9) on a front surface of the substrate 310, and then, patterning the gate insulation layer (330 of FIG. 9) on the elements 321 to 325 to form contact holes 301 to 308 may be performed.

The contact holes 301 to 308 may function as paths which electrically connect the elements 321 to 325A with target metal layers (341, 342, 343, 344, 345, 346, 325B, DL, and PL of FIG. 12) disposed on the elements 321 to 325A. To form the contact holes 301 to 308, the etching process may be used, and the etching process may use, for example, a photolithography process, the dry etching process, and/or the wet etching process.

Figure 12:
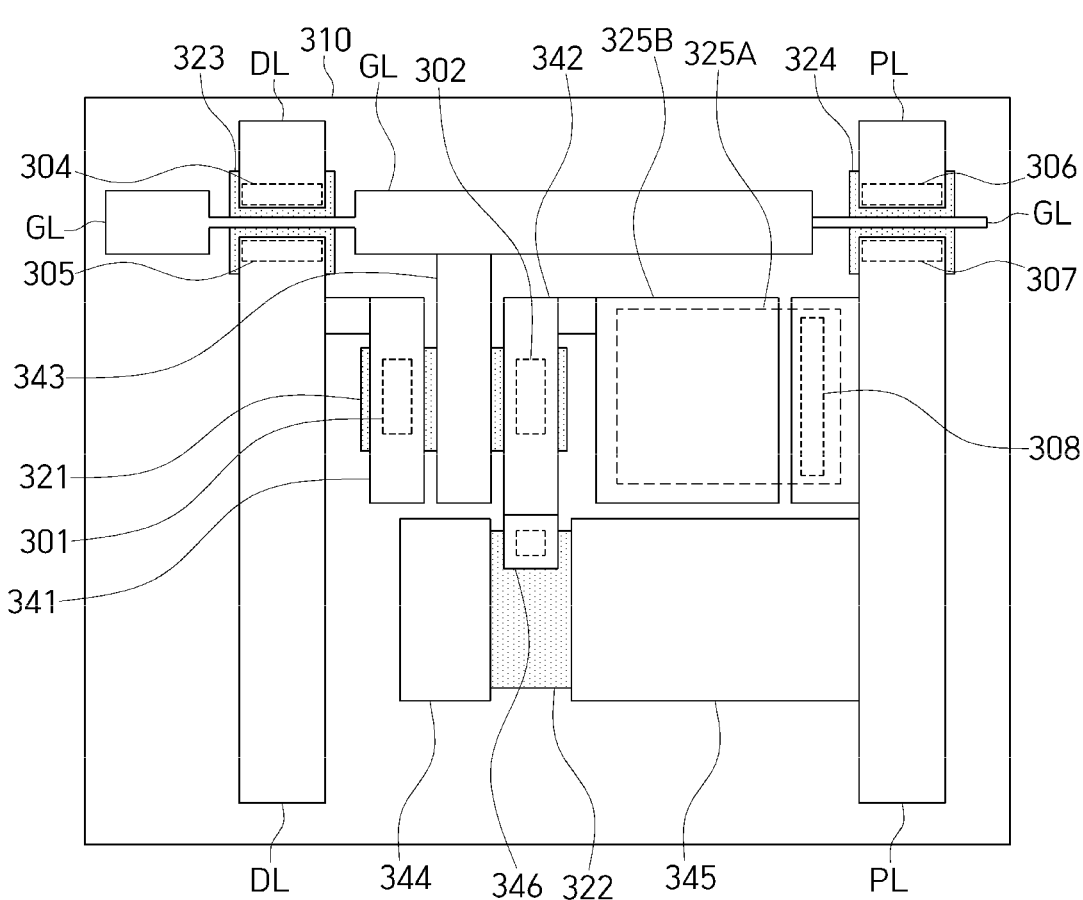

Subsequently, referring to FIG. 12, a process of forming the first source electrode layer 341 of the switch TFT 50, the first drain electrode layer 342 of the switch TFT 50, the first gate electrode layer 343 of the switch TFT 50, the second source electrode layer 344 of the driving TFT 60, the second drain electrode layer 345 of the driving TFT 60, the metal pad layer 346 of the driving TFT 60, a top electrode layer 325B of the storage capacitor (70 of FIG. 8), the data line DL, and the power line PL on the gate insulation layer 360 may be performed.

In detail, the first source electrode layer 341 and the first drain electrode layer 342 may be formed to be electrically connected with the first conductive semiconductor layer 321, formed at a lower portion, through the contact holes 301 and 302. The first gate electrode layer 343 formed between the first source electrode layer 341 and the first drain electrode layer 342 may be formed to be electrically connected with the gate line GL. The second drain electrode layer 345 may be formed to be electrically connected with the power line PL. The metal pad layer 346 may be formed to be electrically connected with the first drain electrode layer 342. The data line DL may be formed to be electrically connected with the first bridge layer 323, formed at a lower portion, through the contact holes 304 and 305. Accordingly, the data line DL may have a path passing through a lower portion of the gate line GL. The power line PL may be formed to be electrically connected with the second bridge layer 324, formed at a lower portion, through the contact holes 306 and 307. Accordingly, the power line PL may have a path passing through the lower portion of the gate line GL.

The elements 341, 342, 343, 344, 345, 346, 325B, DL, and PL may be simultaneously formed by one process. To this end, a photolithography process and a deposition process may be used.

Figure 13:
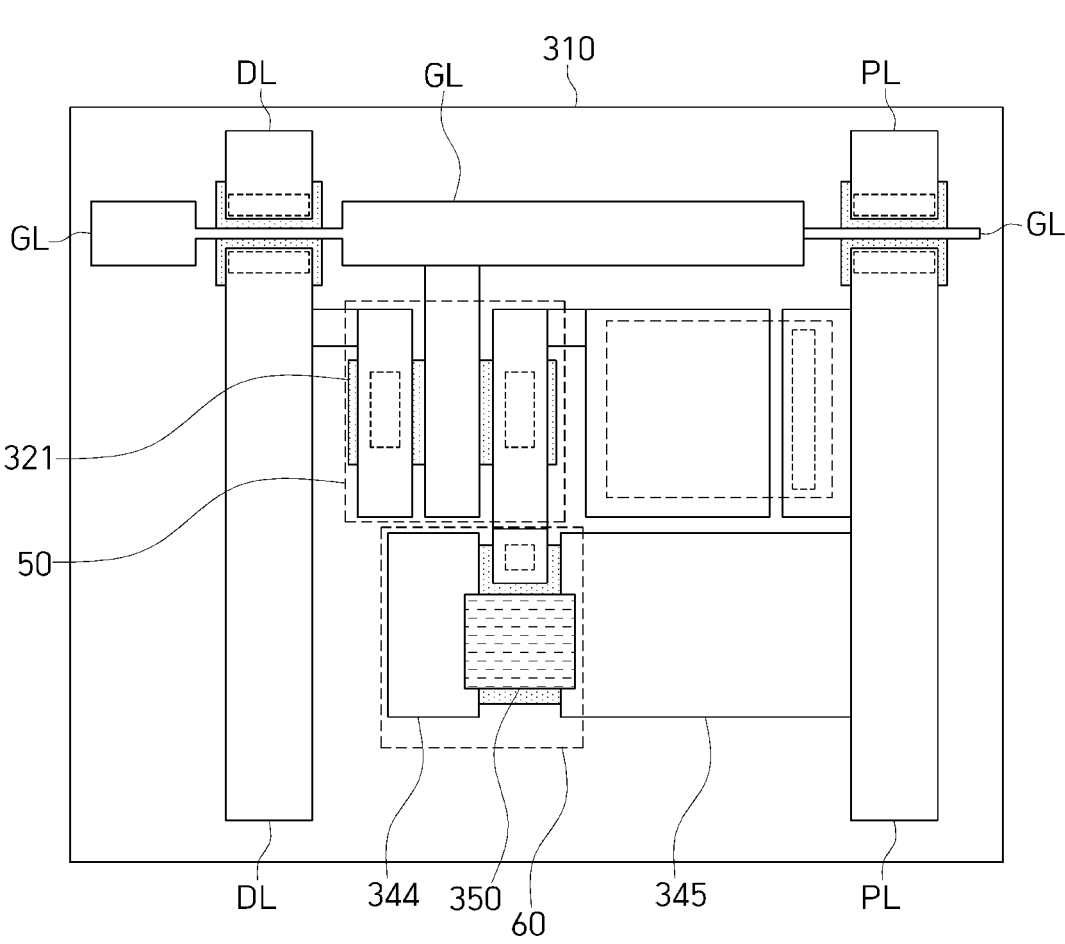

Subsequently, referring to FIG. 13, a process of forming the second conductive semiconductor layer 350 contacting the second source electrode layer 344 and the second drain electrode layer 345 may be performed. Accordingly, the driving TFT 60 may be finished. To form the second conductive semiconductor layer 350, a photolithography process and a deposition process may be used. The second conductive semiconductor layer 350 may be a layer on which a second conductive-type dopant is not doped, like the first conductive semiconductor layer 321. Accordingly, a doping process may be omitted in a process of manufacturing the display pixel according to an embodiment of the present disclosure.

Figure 14:
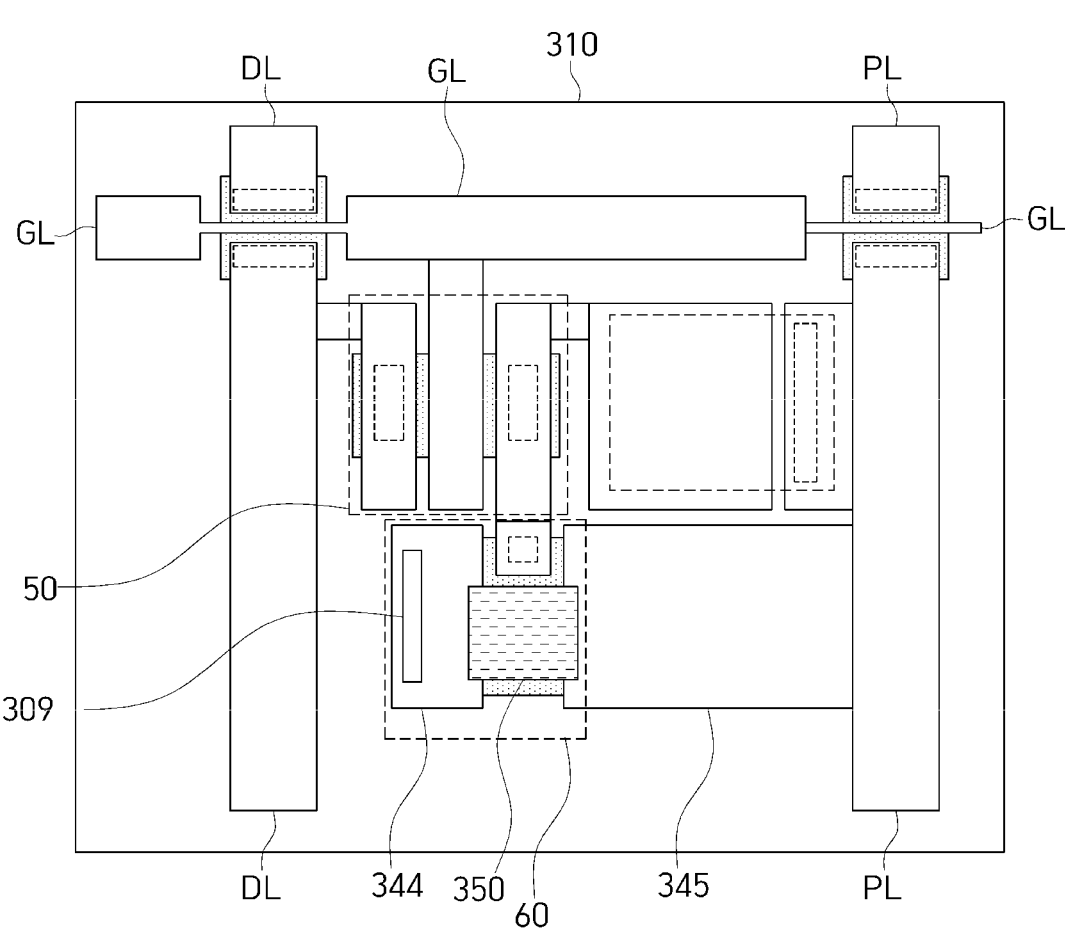

Subsequently, referring to FIG. 14, in order to protect the switch TFT 50 and the driving TFT 60, a process of forming a passivation layer (360 of FIG. 9) all over the substrate 310, and then, patterning the passivation layer 360 to form a contact hole 309 may be performed. A PVD process and/or a CVD process may be used for forming the passivation layer 360, and an etching process including a dry etching process and/or a wet etching process may be formed for forming the contact hole 309.

Figure 15:
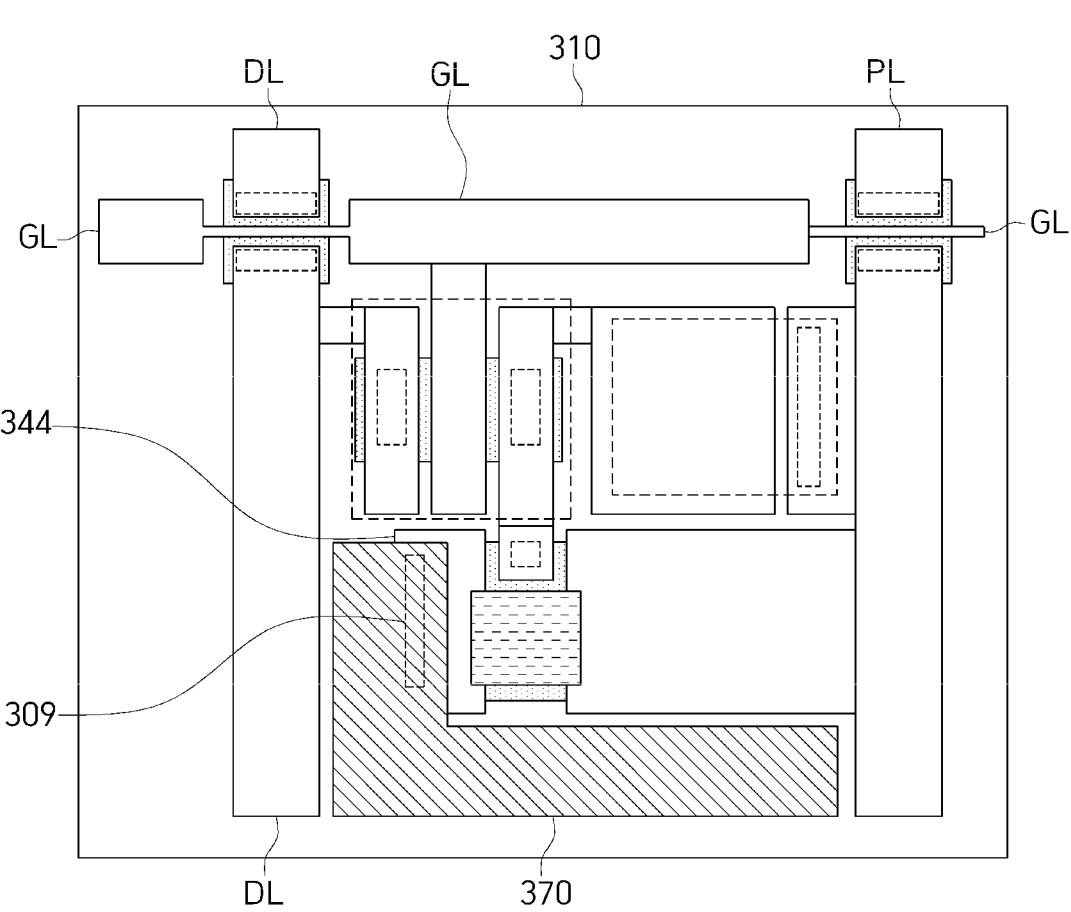

Subsequently, referring to FIG. 15, a process of sequentially forming a pixel electrode layer 370 and an OLED stack 70, electrically connected with the second source electrode layer 344 of the driving TFT 60 through the contact hole 309, on the passivation layer 360, and then, forming an encapsulation layer 380 covering the OLED stack 70 may be performed. The pixel electrode layer 370, the OLED stack 70, and the encapsulation layer 380 may be formed by a photolithography process and a deposition process.

A single pixel may be finished by forming the encapsulation layer 380. When the single pixel is configured as a pixel array, a display backplane may be provided.

According to the embodiments of the present invention, a complementary TFT to which a non-silicon semiconductor capable of a low temperature process is applied may be manufactured by using a substrate having a low heat resistance temperature like a glass or plastic substrate, and thus, the complementary TFT may also be manufactured in a low temperature process.

Moreover, because a first conductive semiconductor layer of a first TFT and a gate electrode of a second conductive TFT are formed of the same material in the same layer, the first conductive semiconductor layer of the first TFT and the gate electrode of the second TFT may be simultaneously formed in the same process without a doping process, and thus, the total number of manufacturing processes on a complementary TFT may decrease.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A complementary thin film transistor (TFT) comprising:
   a substrate; and
   a first TFT and a second TFT disposed on the substrate,
   wherein a first conductive semiconductor layer of the first TFT and a second gate electrode layer of the second TFT are disposed in a same layer and include a same material.

2. The complementary TFT of claim 1, wherein the first TFT comprises:
   a gate insulation layer disposed on the first conductive semiconductor layer;
   a first source electrode layer and a first drain electrode layer disposed on the gate insulation layer and electrically connected with the first conductive semiconductor layer through a first contact hole patterned in the gate insulation layer; and
   a first gate electrode layer disposed between the first source electrode layer and the first drain electrode layer.

3. The complementary TFT of claim 1, wherein the substrate is a non-silicon substrate having a low heat resistance temperature, and
   the non-silicon substrate is a glass substrate.

4. The complementary TFT of claim 1, wherein the substrate, the first TFT, and the second TFT are included in a complementary metal oxide semiconductor (CMOS) logic circuit including a CMOS inverter, a CMOS NAND circuit, a CMOS NOR circuit, a CMOS AND circuit, and a CMOS OR circuit, a CMOS arithmetic logic unit (ALU), a CMOS microprocessor, a CMOS RFID TAG circuit, a CMOS image sensor, and a display pixel circuit.

5. The complementary TFT of claim 1, wherein the first conductive semiconductor layer is an n-type semiconductor layer or a p-type semiconductor layer,
   when the first conductive semiconductor layer is the n-type semiconductor layer, the second gate electrode layer comprises the same material as a material of the n-type semiconductor layer, and
   when the first conductive semiconductor layer is the p-type semiconductor layer, the second gate electrode layer comprises the same material as a material of the p-type semiconductor layer.

6. The complementary TFT of claim 5, wherein the n-type semiconductor layer comprises one material of a zinc oxide (ZnO)-based material, an indium oxide (InO)-based material, a tin oxide (SnO)-based material, a titanium oxide (TiO)-based material, an indium-gallium-zinc oxide (In-GaZnO)-based material, a manganese-tin-indium oxide (ZnSnInO)-based material, an indium tin oxide (InSnO)-based material, and a combination of at least two materials thereof, the p-type semiconductor layer comprises one material of a tellurium (Te)-based material, a tellurium oxide (TeOx)-based material, a selenium (Se)-based material, a copper oxide (CuO)-based material, a tin oxide (SnO)-based material, a nickel oxide (NiOx)-based material, and a combination of at least two materials thereof.

7. The complementary TFT of claim 1, wherein the second TFT comprises:

a gate insulation layer disposed on the second gate electrode layer;

a second source electrode layer and a second drain electrode layer disposed on the gate insulation layer;

a metal pad disposed in a same layer as the second source electrode layer and the second drain electrode layer and electrically connected with the second gate electrode layer; and a second conductive semiconductor layer disposed on the second source electrode layer and the second drain electrode layer.

8. The complementary TFT of claim 7, wherein the metal pad of the second TFT is connected with the second gate electrode layer.

9. The complementary TFT of claim 7, wherein the second conductive semiconductor layer is disposed on an upper surface and a side surface of the second source electrode layer and an upper surface and a side surface of the second drain electrode layer.

10. The complementary TFT of claim 7, wherein the first conductive semiconductor layer of the first TFT is disposed coplanar with the second gate electrode layer of the second TFT.

11. A method of manufacturing a complementary thin film transistor (TFT) including a first TFT and a second TFT, the method comprising:

forming a first conductive semiconductor layer of the first TFT and a second gate electrode layer of the second TFT on a substrate;

forming a gate insulation layer on the first conductive semiconductor layer and the second gate electrode layer;

forming a first gate electrode layer, a first source electrode layer, and a first drain electrode layer of the first TFT on the gate insulation layer, and simultaneously, forming a second source electrode layer and a second drain electrode layer of the second TFT and a metal pad, that is connected with the second gate electrode layer, on the gate insulation layer; and forming a second conductive semiconductor layer electrically connected with the second source electrode layer and the second drain electrode layer, wherein the first conductive semiconductor layer and the second gate electrode layer comprise a same material.

12. The method of claim 11, wherein the forming of the first conductive semiconductor layer of the first TFT and the second gate electrode layer of the second TFT comprises simultaneously forming the first conductive semiconductor layer and the second gate electrode layer in a same layer by using one deposition process.

13. The method of claim 11, wherein the first conductive semiconductor layer is an n-type semiconductor layer or a p-type semiconductor layer, when the first conductive semiconductor layer is the n-type semiconductor layer, the second gate electrode layer comprises the same material as a material of the n-type semiconductor layer, and when the first conductive semiconductor layer is the p-type semiconductor layer, the second gate electrode layer comprises the same material as a material of the p-type semiconductor layer.

14. The method of claim 11, wherein the substrate is a non-silicon substrate having a low heat resistance temperature, and the non-silicon substrate is a glass substrate including quartz or sapphire.

15. A pixel structure comprising:

a substrate;

a switch thin film transistor (TFT) structure and a driving TFT structure disposed on the substrate;

a passivation layer covering the switch TFT structure and the driving TFT structure;

a pixel electrode layer disposed on the passivation layer and electrically connected with a source electrode layer of the driving TFT through a contact hole formed in the passivation layer; and an organic light emitting diode (OLED) layer disposed on the pixel electrode layer, wherein a first conductive semiconductor layer of the switch TFT structure and a gate electrode layer of the driving TFT structure are disposed in a same layer and include a same material, wherein the driving TFT structure includes:

a gate insulation layer disposed on the gate electrode layer;

a source electrode layer and a drain electrode layer disposed on the gate insulation layer;

a metal pad layer electrically connected with the gate electrode layer; and a second conductive semiconductor layer disposed on the source electrode layer and the drain electrode layer.

16. The pixel structure of claim 15, wherein, when the first conductive semiconductor layer is an n-type semiconductor layer, the gate electrode layer comprises the same material as a material of the n-type semiconductor layer, and when the first conductive semiconductor layer is a p-type semiconductor layer, the gate electrode layer comprises the same material as a material of the p-type semiconductor layer.

17. The pixel structure of claim 15, wherein the first conductive semiconductor layer is a channel layer on which impurities are not doped.

18. The pixel structure of claim 15, wherein the first conductive semiconductor layer and the gate electrode layer are simultaneously formed by one process.

19. The pixel structure of claim 15, wherein the first conductive semiconductor layer of the switch TFT structure is disposed coplanar with the gate electrode layer of the driving TFT structure.

* * * * *